(12) United States Patent
Schimmel et al.

(10) Patent No.: US 9,310,689 B2
(45) Date of Patent: Apr. 12, 2016

(54) RADIATION SOURCE AND LITHOGRAPHIC APPARATUS

(75) Inventors: Hendrikus Gijsbertus Schimmel, Utrecht (NL); Johan Frederik Dijksman, Weert (NL); Dzmitry Labetski, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/241,378

(22) PCT Filed: Jul. 31, 2012

(86) PCT No.: PCT/EP2012/064945
§ 371 (c)(1),
(2), (4) Date: Feb. 26, 2014

(87) PCT Pub. No.: WO2013/029902
PCT Pub. Date: Mar. 7, 2013

(65) Prior Publication Data
US 2015/0002830 A1 Jan. 1, 2015

Related U.S. Application Data

(60) Provisional application No. 61/530,766, filed on Sep. 2, 2011.

(51) Int. Cl.
*G03F 7/20* (2006.01)
*H05G 2/00* (2006.01)

(52) U.S. Cl.
CPC ............ *G03F 7/70033* (2013.01); *H05G 2/003* (2013.01); *H05G 2/006* (2013.01); *H05G 2/005* (2013.01)

(58) Field of Classification Search
USPC ............................. 355/67; 250/493.1, 504 R
See application file for complete search history.

(56) References Cited

U.S. PATENT DOCUMENTS

| 7,075,616 B2 | 7/2006 | Derksen et al. |
| 7,449,283 B2 | 11/2008 | Nishi et al. |
| 7,482,607 B2 | 1/2009 | Lerner et al. |

(Continued)

FOREIGN PATENT DOCUMENTS

| CN | 1501172 A | 6/2004 |
| CN | 1684834 A | 10/2005 |

(Continued)

OTHER PUBLICATIONS

English-Language Abstract for International Patent Publication No. 2009/068182 A1, published Jun. 4, 2009; 1 page.

(Continued)

*Primary Examiner* — Phillip A Johnston
*Assistant Examiner* — Hsien Tsai
(74) *Attorney, Agent, or Firm* — Sterne, Kessler, Goldstein & Fox P.L.L.C.

(57) ABSTRACT

Methods and apparatus are provided for promoting the coalescence of fuel droplets in a stream generated by a radiation source droplet stream generator for use in lithographic apparatus. Various examples are described in which a modulating voltage source is applied to the emitter so that the electrical characteristics of the droplets may be controlled. This results in acceleration and deceleration of droplets in the stream which causes them to merge and promotes coalescence.

29 Claims, 4 Drawing Sheets

(56) References Cited

U.S. PATENT DOCUMENTS

Figure 1:
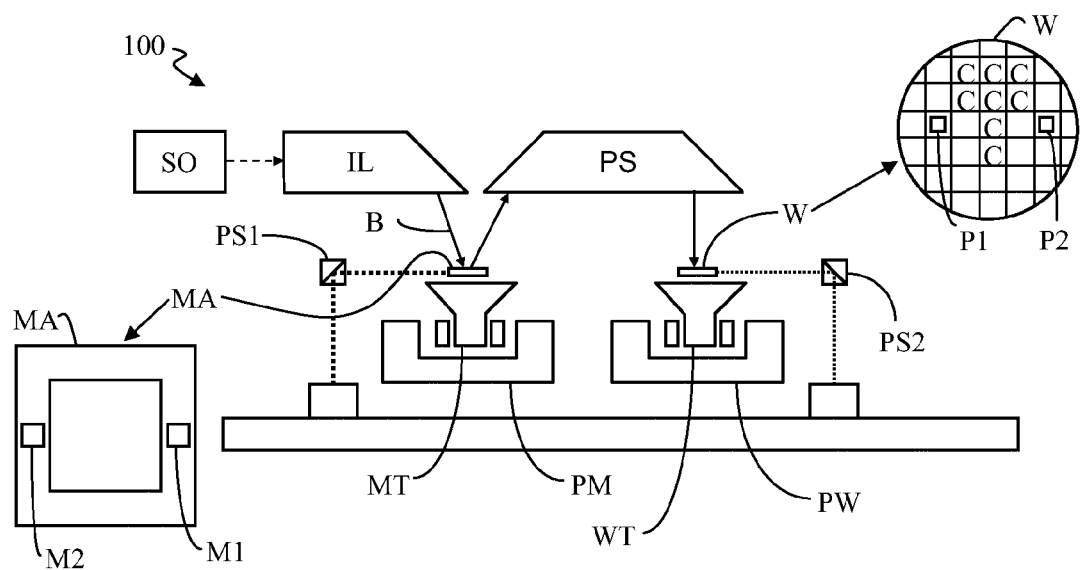

| | | | |
|---|---|---|---|
| 7,835,583 B2 | 11/2010 | Jackson | |
| 7,838,854 B2* | 11/2010 | Algots | H05G 2/003 250/504 R |
| 7,897,947 B2 | 3/2011 | Vaschenko | |
| 2008/0035865 A1 | 2/2008 | Komori et al. | |
| 2009/0014668 A1* | 1/2009 | Vaschenko | 250/504 R |
| 2009/0272919 A1 | 11/2009 | Abe et al. | |
| 2010/0321478 A1* | 12/2010 | Sliwa et al. | 348/51 |
| 2011/0101863 A1* | 5/2011 | Komori | G03F 7/70033 315/111.41 |

FOREIGN PATENT DOCUMENTS

| | | |
|---|---|---|
| CN | 101196695 A | 6/2008 |
| CN | 101443853 A | 5/2009 |
| EP | 1 925 981 A2 | 5/2008 |
| JP | 2010-146956 A | 7/2010 |
| WO | WO 2009/068182 A1 | 6/2009 |
| WO | WO 2010/111231 A1 | 9/2010 |

OTHER PUBLICATIONS

English-Language Abstract for Japanese Publication No. 2010-146956 A, published Jul. 1, 2010; 1 page.

International Search Report directed to related International Patent Application No. PCT/EP2012/064945, mailed Sep. 13, 2012; 4 pages.

International Preliminary Report on Patentability and Written Opinion of the International Searching Authority directed to related International Patent Applicatin No. PCT/EP2012/064945, issued Mar. 4, 2014; 9 pages.

Xu, B., et al., "Droplet Coalescence in Microfluidic Systems," Micro and Nanosystems, vol. 3, No. 2, 2011; pp. 131-136.

* cited by examiner

RADIATION SOURCE AND LITHOGRAPHIC APPARATUS

CROSS-REFERENCE TO RELATED APPLICATIONS

This application claims the benefit of U.S. provisional application 61/530,766, which was filed on Sep. 2, 2011, and which is incorporated herein in its entirety by reference.

FIELD

The present invention relates to a radiation source and to a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus reduce the minimum printable size, it has been proposed to use an extreme ultraviolet (EUV) radiation source. EUV radiation is electromagnetic radiation having a wavelength within the range of 5-20 nm, for example within the range of 13-14 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as droplets of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

It may be difficult to deliver to a plasma formation location droplets of fuel material having a desired size and a desired separation.

SUMMARY

It is desirable to provide a radiation source and lithographic apparatus which is novel and inventive compared with known radiation sources.

According to a first aspect of the present invention there is provided a radiation source fuel droplet generator comprising a fuel droplet emitter connected to a modulating voltage source configured to apply a first voltage to a first portion of a stream of fuel droplets and to apply a second voltage to a second portion of a stream of fuel droplets, a first electrode located close to the fuel droplet emitter, and a second electrode located further away from the fuel droplet emitter, and a voltage source configured to apply a potential difference between the first and second electrodes and thereby generate an electric field between the first and second electrodes which applies a decelerating force to one of the first and second portions of the stream of fuel droplets and applies an accelerating force to the other of the first and second portions of the stream of fuel droplets.

In one example, the first and second voltages are respectively positive and negative relative to a voltage at which the first electrode is held which may be at zero potential. In one example, the potential difference between the first and second electrodes is substantially constant.

In some embodiments of the present invention no voltage is applied to the stream of droplets for a period of time between the application of the first voltage and the second voltage.

The magnitude of the first voltage relative to the voltage applied to the first electrode may be the same as or different from the magnitude of the second voltage relative to the voltage applied to the first electrode.

The first voltage and the second voltage may be applied either for the same periods of time or for different periods of time.

According to a second aspect of the present invention there is provided a radiation source fuel droplet stream generator comprising a fuel droplet emitter and an electrode located close to the formation point of droplets formed by the emitter, and a voltage source for applying an alternating voltage between the emitter and the electrode whereby alternate droplets in a stream are given electrical charges of alternating sign.

In one example, in a sequence of droplets the magnitude of the charge on every other droplet increases. In one example, after such a sequence there may be a period of time in which no voltage is applied before the next sequence. Further In one example, the application of the alternating voltage may be synchronized with the formation of droplets.

According to a third aspect of the present invention there is provided a radiation source fuel droplet stream generator comprising a fuel droplet emitter and an electrode, and a voltage source for applying an alternating voltage between the emitter and the electrode whereby a stream of droplets is formed of opposite electrical signs or of the same sign but different magnitudes and which are either accelerated or decelerated towards the electrode promoting coalescence of the droplets.

In one example, a constant voltage may additionally be applied to the emitter.

According to a fourth aspect of the present invention there is provided a radiation source fuel droplet stream generator comprising, a fuel droplet emitter, an electrode, and a modulating voltage source connected to the emitter for controlling the relative speeds of droplets between the emitter and the electrode whereby coalescence of smaller droplets into larger droplets is facilitated.

In one example, the relative speed of droplets is controlled by providing different droplets with opposite charges in an electric field, and/or by providing different droplets with charges of different magnitudes. In one example, the relative speed of droplets is controlled by modulating an electric field.

According to a fifth aspect of the present invention there is provided a lithographic apparatus comprising a radiation source as defined above, and further comprising an illumination system configured to condition a radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate.

According to a sixth aspect of the present invention there is provided a method of promoting coalescence of radiation fuel source droplets emitted from a fuel droplet emitter comprising controlling the relative speeds of droplets in a stream by applying a modulating voltage to the emitter.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

FIG. 1 schematically depicts a lithographic apparatus according to an embodiment of the present invention.

Figure 2:
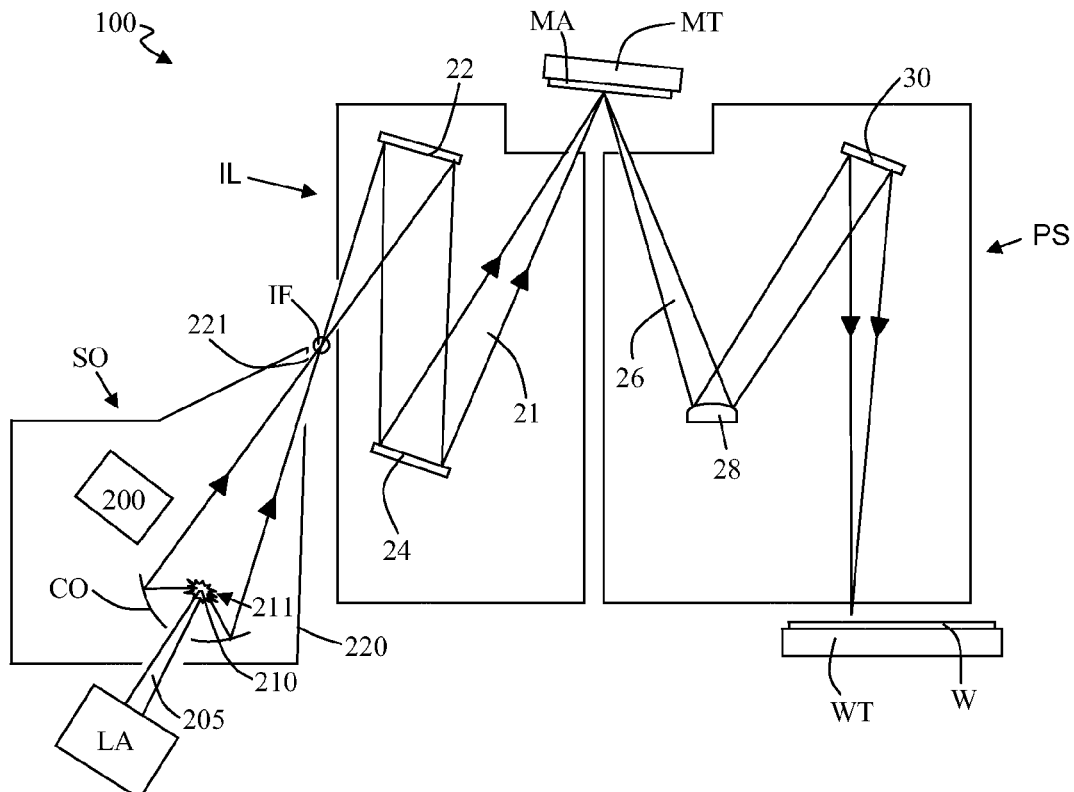

FIG. 2 is a more detailed view of the apparatus of FIG. 1, including an LPP source collector module.

Figure 3:
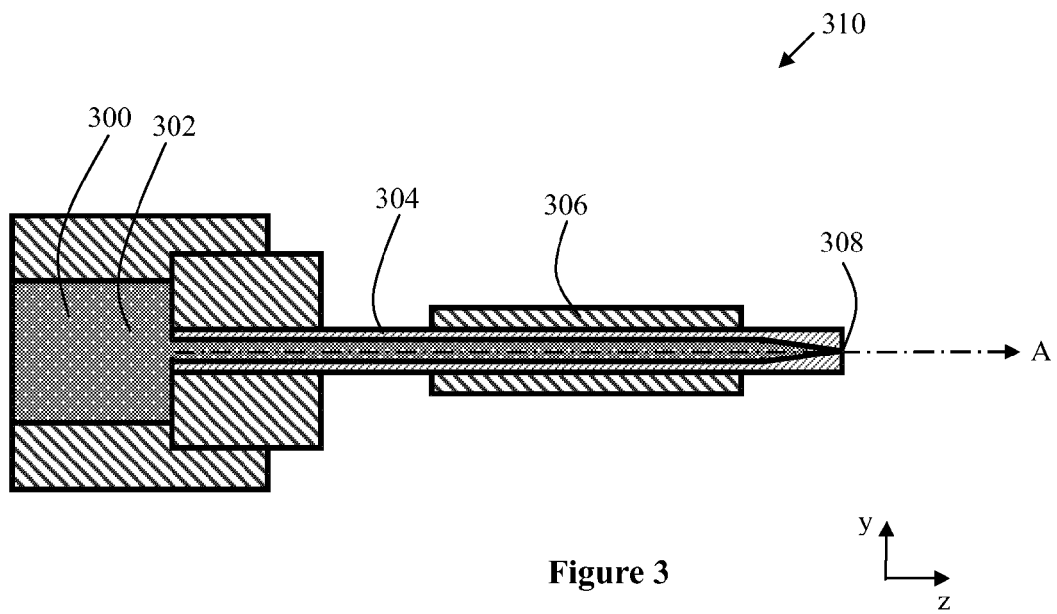

FIG. 3 schematically depicts a fuel droplet emitter which may form part of the lithographic apparatus shown in FIGS. 1 and 2.

Figure 4:
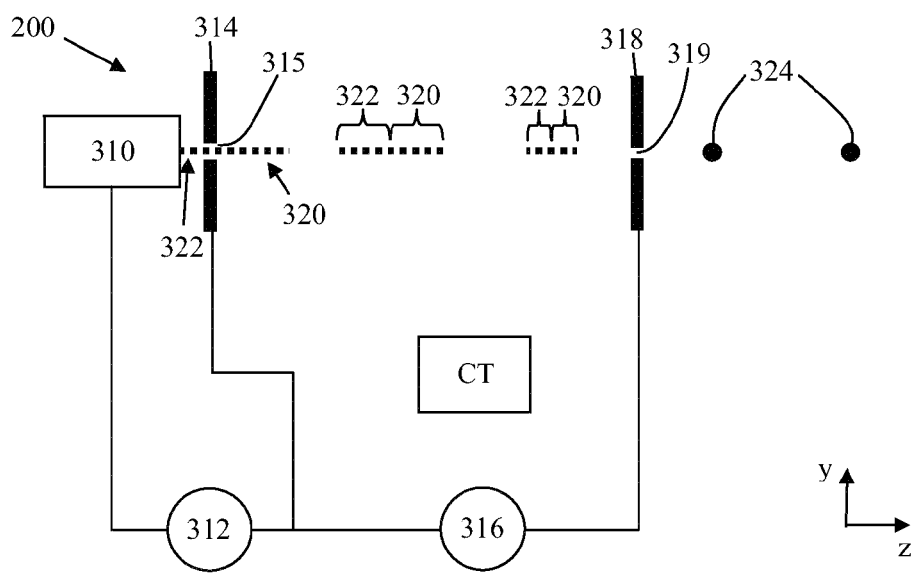
Figure 4:
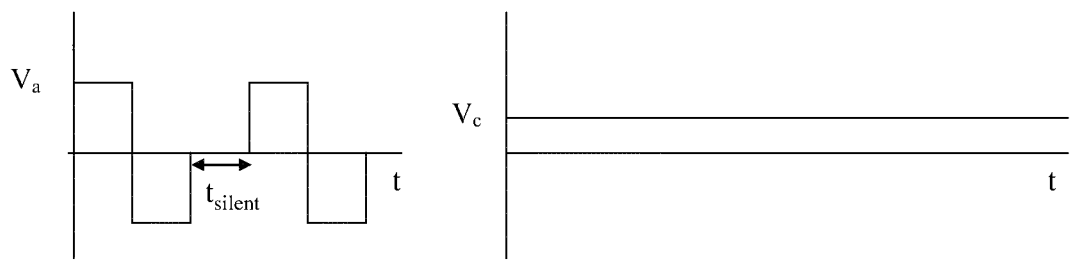

FIG. 4 schematically depicts a fuel droplet stream generator which may form part of a radiation source according to an embodiment of the present invention.

Figure 5:
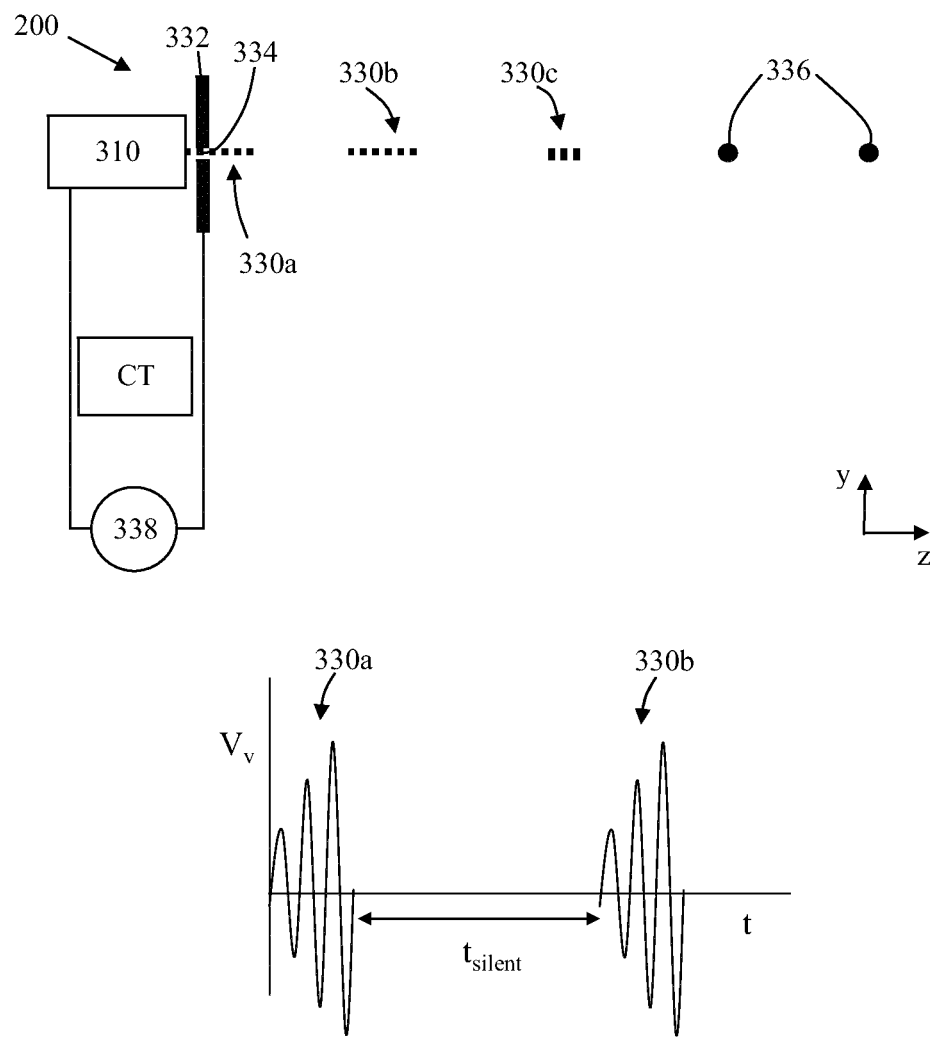

FIG. 5 schematically depicts an alternative fuel droplet stream generator which may form part of a radiation source according to an embodiment of the present invention.

Figure 6:
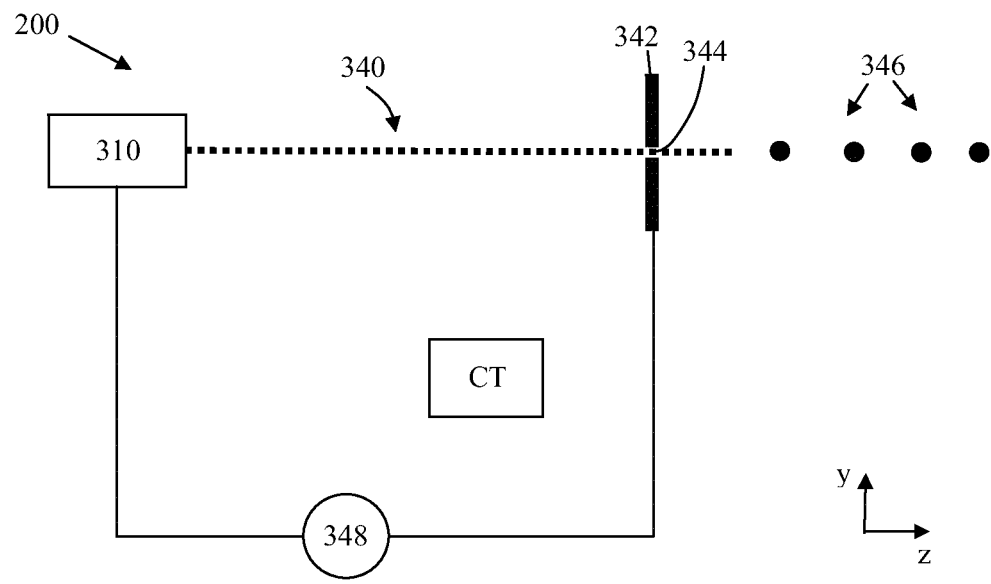
Figure 7:
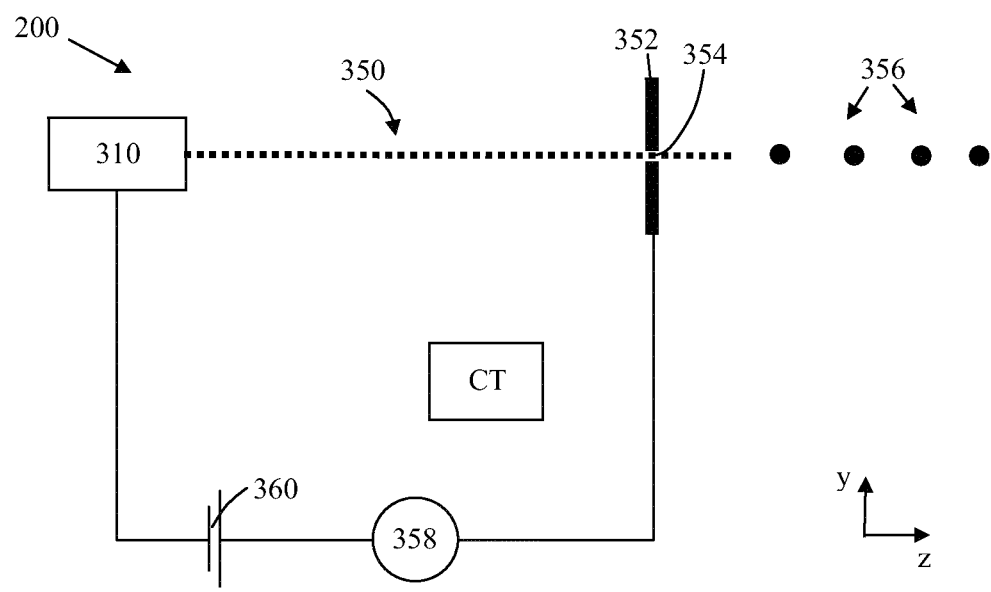

FIG. 6 schematically depicts a further alternative fuel droplet stream generator which may form part of a radiation source according to an embodiment of the present invention. and FIG. 7 schematically depicts a further alternative fuel droplet stream generator which may form part of a radiation source according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus. The apparatus comprises an illumination system (illuminator) IL configured to condition a radiation beam B (e.g., UV radiation or DUV radiation), a support structure (e.g., a mask table) MT constructed to support a patterning device (e.g., a mask)

MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultraviolet (EUV) radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet of material having the required line-emitting element, with a laser beam. The source collector module SO may be part of an EUV radiation source including a laser, not shown in FIG. 1, for providing the laser beam exciting the fuel. The resulting plasma emits output radiation, e.g., EUV radiation, which is collected using a radiation collector, disposed in the source collector module.

The laser and the source collector module may be separate entities, for example when a CO2 laser is used to provide the laser beam for fuel excitation. In such cases, the radiation beam is passed from the laser to the source collector module with the aid of a beam delivery system comprising, for example, suitable directing mirrors and/or a beam expander. The laser and a fuel supply may be considered to comprise an EUV radiation source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensing system PS2 (e.g., using interferometric devices, linear encoders or capacitive sensors), the substrate table WT can be moved accurately, e.g., so as to position different target portions C in the path of the radiation beam B. Similarly, the first positioner PM and another position sensing system PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

FIG. 2 shows the lithographic apparatus 100 in more detail, including the source collector module SO, the illumination system IL, and the projection system PS. The source collector module SO is constructed and arranged such that a vacuum environment can be maintained in an enclosing structure 220 of the source collector module.

A laser LA is arranged to deposit laser energy via a laser beam 205 into a fuel, such as xenon (Xe), tin (Sn) or lithium (Li) which is provided from a fuel droplet stream generator 200. This creates a highly ionized plasma 210 at a plasma formation location 211 which has electron temperatures of several 10's of eV. The energetic radiation generated during de-excitation and recombination of these ions is emitted from the plasma, collected and focussed by a near normal incidence radiation collector CO. The laser LA and fuel droplet stream generator 200 may together be considered to comprise an EUV radiation source. The EUV radiation source may be referred to as a laser produced plasma (LPP) source.

A second laser (not shown) may be provided, the second laser being configured to preheat the fuel before the laser beam 205 is incident upon it. An LPP source which uses this approach may be referred to as a dual laser pulsing (DLP) source.

Radiation that is reflected by the radiation collector CO is focused at a virtual source point IF. The virtual source point IF is commonly referred to as the intermediate focus, and the source collector module SO is arranged such that the intermediate focus IF is located at or near to an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21 at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in the illumination system IL and projection system PS. Furthermore, there may be more mirrors present than those shown in the figures, for example there may be 1-6 additional reflective elements present in the projection system PS than shown in FIG. 2.

FIG. 3 schematically shows a fuel droplet emitter 310 of the fuel droplet stream generator. The fuel droplet emitter 310 comprises a reservoir 300 which contains a fuel liquid 302 (for example liquid tin). The reservoir 300 is connected to a capillary 304 which is encircled by a piezo-electric actuator 306. A firm connection is provided between the piezo-electric actuator 306 and the capillary 304 (e.g., using a suitable bonding material) such that vibrations may travel from the piezo-electric actuator to the capillary. The capillary 304 is provided with a nozzle 308 from which fuel material is ejected along a trajectory A. The trajectory A is coaxial with an axis which runs along the centre of the capillary 304, as is represented schematically by the dotted line which passes through the center of the capillary.

In an embodiment, the nozzle 308 may have a diameter of 3-5 microns. The capillary 304 may for example be 25 millimeters long, with an outer diameter of 1 millimeter and a wall thickness of 0.2 millimeters. The piezo-electric actuator 306 may for example be around 10 mm long, and may be fixed to the capillary 304 using an adhesive. The adhesive may be a high temperature adhesive, i.e., one which does not loose adhesion at the operating temperature of the fuel supply 200. The piezo-electric actuator 306 is configured such that it may squeeze the capillary 304 with a desired modulation frequency, thereby modulating the pressure within the capillary with the effect that the speed of the stream may be varied.

In use, the liquid fuel 302 is held at pressure inside the reservoir 300. This may be achieved for example by pressuring gas (not shown) which is also located in the reservoir 300, such that pressure is applied to the liquid fuel by the gas. As a result of the pressure a stream of fuel issues from the nozzle 308. In the absence of the piezo-electric actuator 306 the stream would naturally break-up after travelling a distance from the nozzle 308 (the distance being for example 100-1000 times the diameter of the nozzle), thereby forming a stream of droplets. This is referred to as Rayleigh break-up. When Rayleigh break-up occurs, fuel droplets are formed with a diameter which is around twice the diameter of the nozzle 308 or slightly less than this, and with a separation around 4.5 times the diameter of the nozzle. Although Rayleigh break-up of the stream of fuel liquid will occur without actuation of the piezo-electric actuator 306, the piezo-electric actuator 306 may be used to control the Rayleigh break-up by modulating the pressure inside the capillary 304.

It is important to note, however, the other types of fuel droplet emitter may be used in embodiments of this invention. In particular possible droplet emitters include those that generate a continuous stream of droplets by a Rayleigh break-up mechanism that can be assisted or tuned by mechanical means. Other possible droplet emitters are those that may be termed droplet-on-demand emitters in which droplets are produced by some mechanical and/or electrical stimulus. The resulting droplet stream of the droplet-on-demand emitters can have a constant droplet frequency. Alternatively, the time between droplets can be varied as required.

Cartesian coordinates are indicated in FIG. 3 and in some of the other figures in order to allow the reader to easily understand relative orientations of apparatus shown in different figures. The Cartesian coordinates are not intended to imply that apparatus must have a particular orientation.

The fuel droplet stream generator 200 is shown schematically in FIG. 4. The fuel droplet stream generator 200 includes the fuel droplet emitter 310 of FIG. 3, and further includes a first electrode 314 and a second electrode 318. A modulating voltage source 312 is connected between the fuel droplet emitter 310 and the first electrode 314. A constant voltage source 316 is connected between the first electrode 314 and the second electrode 318. First electrode 314 is held at a fixed voltage which may be ground, though it is also possible that second electrode 318 or the droplet emitter may be grounded.

The modulating voltage source 312 is configured to apply a voltage which switches from a constant positive value Va to a constant negative value −Va, followed by zero voltage. The positive voltage Va is applied for a period of time which corresponds with the time taken for the fuel droplet emitter 310 to emit half of the droplets of a stream of droplets, and the negative voltage −Va is applied for the period of time which corresponds with the time taken to emit the other half of the stream of droplets. The first half of the stream of droplets is indicated as 320 in FIG. 4, and the second half of the stream of droplets is indicated as 322. Because a positive voltage Va is applied when the first half 320 of the stream of droplets is emitted, these droplets have a positive charge. Similarly, because a negative voltage −Va is applied when the second half 322 of the stream of droplets is emitted, these droplets have a negative charge. It should be understood in this context that the terms negative voltage and positive voltage are with respect to the fixed voltage of electrode 314. If electrode 314 is held at zero then these terms means positive and negative in absolute terms, but if for example electrode 314 is held at a positive voltage then it is possible for a voltage to be applied to the droplet emitter 310 that is positive in absolute terms but negative compared with the voltage of electrode 314. It will also be understood that the alternating voltage Va serves not only to charge the droplets but also to accelerate them. It is possible that when voltage Va changes polarity a small number of droplets already travelling between the emitter 310 and the electrode 314 may be decelerated because they are the "wrong" charge, but if the distance between the emitter 310 and the electrode 314 is small these will be few in number representing only a small fraction of the droplets in a stream and will not significantly affect the overall acceleration of droplets.

After the second half 322 of the stream of droplets has been emitted the voltage applied by the modulating voltage source 312 goes to zero and droplets are not charged. The voltage may remain at zero a period tsilent which corresponds with the period between the end of the stream of charged droplets and the start of the next stream of charged droplets. The period tsilent may be any suitable period. In an embodiment, the period tsilent may be zero, i.e., such that the voltage immediately changes from −Va to Va. In an embodiment, there may be no gap between the end of the second half of a stream of droplets and the start of the first half of a subsequent stream of droplets.

The first electrode 314 has a zero potential (or at least a fixed potential—it need not be zero as this embodiment of the present invention would still work if the emitter and both electrodes were all raised by the same fixed potential) and the second electrode 318 is set to a fixed positive (relative to electrode 314) voltage by the constant voltage supply 316. In this way there is a constant electric field generated between electrodes 314 and 318 in which negatively charged droplets 322 are accelerated and positively charged droplets 320 are decelerated. This will result in the speed of droplets varying—some will be faster than others—and high-speed droplets will overtake low-speed droplets. In this example the high-speed droplets will be negatively charged and the low-speed droplets will be positively charged and so as a high-speed droplet passes a low-speed droplet there will be electrical attraction that will facilitate and encourage coalescence.

The voltage modulation and phase difference is such that when negatively charged fuel droplets 322 are emitted from the fuel droplet emitter 310 the first electrode 314 has a positive charge. The first electrode 314 therefore attracts the fuel droplets 322, causing the fuel droplets to accelerate. The fuel droplets 322 pass through the opening 315 in the second electrode 314. When the fuel droplets 322 pass through the opening they have a velocity which is higher than the velocity that they had when they were emitted from the fuel droplet emitter 310.

After the fuel droplets 320, 322 have passed the first electrode 314, the fuel droplets experience an electric field generated by the voltage applied by the constant voltage source 316 to the second electrode 318. This voltage is a constant positive voltage Vc, and consequently the positively charged fuel droplets 320 which form the first half of the droplet stream experience a repulsive force and are decelerated. The negatively charged fuel droplets 322 which form the second half of the droplet stream experience an attractive force and are accelerated. This causes the negatively charged fuel droplets 322 and the positively charged fuel droplets 320 to move closer to one another, thereby promoting coalescence of the fuel droplets into a single fuel droplet. The stream of droplets 320, 322 thus coalesces to a single droplet 324. This coalescence may take place before the second electrode 318. It should also be noted that depending on the choice of whether the electrode 318 is at a potential higher or lower than electrode 314, and also depending on the sequence of droplets in a stream, i.e., whether positively charged droplet precede negatively charged droplets or vice versa, the positively and negatively charged droplets within an individual stream may coalesce or the positively charged droplets in one stream may coalesce with the negatively charged droplets in an immediately adjacent stream. It will further be understood that this embodiment can be used with a droplet emitter 310 of the type that can produce spaced groups of droplets (this is the embodiment that is shown) or can be used with a droplet emitter 310 of the type that produces a continuous stream of droplets.

If there are equal numbers of positively charged and negatively charged droplets and all of these charged droplets have the same magnitude of charge then the resulting coalesced larger droplets will be electrically neutral. It is possible, however, to form coalesced particles with an electrical charge either by forming unequal numbers of positively and negatively charged particles (which may be done by having unequal periods when Va is high and low) and/or by having different magnitudes of positive and negative charge (which may be done by having different magnitudes for the positive Va and the negative Va). If the coalesced droplet is formed between electrodes 314 and 318 with an electric charge this may enable further acceleration.

The single droplet 324 or a stream of remaining uncoalesced droplets passes through an opening 319 in the second electrode 318. The fuel droplet stream generator 200 thus generates a series of fuel droplets 324 which may travel to the plasma formation location 211 (see FIG. 2), and which may be used to generate an EUV radiation emitting plasma. The fuel droplets 324 have a neutral charge because they are formed from a combination of positively charged fuel droplets 320 and negatively charged fuel droplets 322.

In common with known fuel droplet stream generators the size of the fuel droplets 324, their speed and their separation may be partially determined by the diameter of the nozzle 308 of the fuel droplet emitter 310, the pressure applied to fuel in the reservoir 300, and the modulation applied by the piezoelectric actuator 306 (see FIG. 3). However, in addition, the speed of the fuel droplets 324 may be modified by the voltage applied to the first electrode 314. In addition, the likelihood of incomplete coalescence of a stream of droplets to form a single droplet occurring is reduced due to the voltage applied to the second electrode 318.

A controller CT may be used to control the voltage applied to the fuel droplet emitter 310, and to control the voltages applied to the electrodes 314, 318 332. The controller CT may also control actuation of the piezoelectric actuator of the fuel droplet emitter 310, and may control other aspects of the fuel droplet emitter.

In the above description the modulation of the voltage provided by the modulating voltage source 312 is from positive to negative, and the constant voltage provided by the constant voltage source 316 is positive. However, the signs of the voltages may be swapped, i.e., such that the modulation of the voltage provided by the modulating voltage source 312 is from negative to positive, and the constant voltage provided by the constant voltage source is negative.

As is represented schematically in FIG. 4, the distance between the first electrode 314 and the fuel droplet emitter 310 may be smaller than the distance between the first electrode and the second electrode 318. Indeed, in one example, the distance between the emitter 310 and the first electrode 314 is of the order of the distance between droplets as they leave emitter 310 but the distance is shown greater in FIG. 4 for clarity of illustration.

The voltage applied to the first electrode may be configured to accelerate the droplets of the stream of fuel droplets 320, 322 to the same speed.

The openings 315, 319 in the electrodes 314, 318 may have any suitable shape and size. The openings 315, 319 may be fully encircled by the electrodes 314, 318 or may be partially encircled by the electrodes.

The embodiment of the present invention shown in FIG. 4 may be combined with a modulation applied by the piezo-electric actuator 306 (see FIG. 3) that promotes Rayleigh breakup of the fuel emitted by the fuel droplet emitter 310. The frequency of actuator can be close to the Rayleigh break-up frequency (i.e., within a factor of 10). An advantage of using a piezo-electric actuator is that the position of the droplet formation due to the Rayleigh break-up mechanism becomes well-defined. This means that the distance between the droplet formation point and electrode 314 becomes better defined.

The embodiment shown in FIG. 4 may be combined with an additional signal on top of signal Va, with a frequency close (within a factor 10) to the Rayleigh break-up frequency so as to promote Rayleigh break-up.

In the present example the nozzle may for example have a diameter of 4 microns. The fuel droplets may be formed by Rayleigh break-up and may have a diameter of 7 microns. The droplets may be separated by a distance which is around 18 microns. The Rayleigh frequency, which corresponds with the rate of droplet production of the nozzle 308, is related to the mean velocity of the fuel at the nozzle and the diameter of the nozzle:

$$f_{Rayleigh} = \frac{mean\ velocty}{4.5\ nozzle\ diameter} \quad \text{(Equation 1)}$$

Although Rayleigh break-up of the stream of fuel liquid will occur without actuation of the piezo-electric actuator 306, the piezo-electric actuator 306 may be used to control the Rayleigh break-up by modulating the pressure inside the capillary 304. Modulating the pressure inside the capillary 304 modulates the exit velocity of the liquid fuel from the nozzle 308, and causes the stream of liquid fuel to break-up into droplets in a controlled manner directly after leaving the nozzle. If the frequency applied by the piezo-electric actuator 306 is sufficiently close to the Rayleigh frequency, droplets of fuel are formed, the droplets being separated by a distance which is determined by the mean exit velocity from the fuel nozzle 308 and by the frequency applied by the piezo-electric actuator 306. The droplets of fuel may be accelerated by the embodiment of the present invention shown in FIG. 4. Coalescence of the droplets of fuel to form a larger droplet may be promoted by the embodiment of the present invention shown in FIG. 4.

If the frequency applied by the piezo-electric actuator 306 is significantly lower than the Rayleigh frequency, then instead of a series of fuel droplets being formed, clouds of fuel are formed. A given cloud of fuel may include a group of droplets travelling at a relatively high speed and a group of droplets travelling at a relatively low speed (the speeds being relative to the average speed of the cloud of fuel). These may coalesce together to form a single fuel droplet. In this way a series of fuel droplets may be generated by applying a frequency to the piezo-electric actuator 306 which is significantly lower than the Rayleigh frequency. The embodiment of the present invention shown in FIG. 4 may be used in combination with clouds of fuel.

It should also be noted that in the embodiment of FIG. 4 the electrode 314 may consist of a cascade of electrodes spaced at known distances such that the droplets are accelerated to even higher speeds, or lower voltages can be used to accelerate the droplets.

An alternative embodiment of the present invention is shown schematically in FIG. 5. The alternative embodiment of the present invention comprises a fuel droplet emitter 310 and an electrode 332, a modulating voltage source 338 being connected between them. The fuel droplet emitter 310 may be configured to emit streams of fuel droplets, each stream possibly being separated in time. In the illustrated embodiments each stream of droplets 330a-c comprises six droplets. However, each stream of droplets may comprise any suitable number of droplets. The distance between the streams is arbitrary.

The modulating voltage source 338 is configured to apply a voltage $V_v$ which alternates between positive and negative values. The frequency at which the voltage alternates between positive and negative values is half the frequency at which droplets of fuel are emitted by the fuel droplet emitter 310. Thus, in the illustrated embodiment, the voltage is positive when a first droplet of a first stream of droplets 330a is emitted, is negative when a second droplet of the first stream of droplets is emitted, is positive when a third droplet of the first stream of droplets is emitted, etc. As a result, the first, third and fifth droplets of the first stream of droplets 330a are positively charged, and the second, fourth and sixth droplets of the first stream of droplets are negatively charged. After the last droplet of the first stream of droplets 330a has been emitted the voltage $V_v$ drops to zero and remains at zero until a first droplet of the second stream of droplets 330b is emitted by the fuel droplet emitter 310. The voltage $V_v$ is then applied during emission of the second stream of droplets 330b in the same way as it was applied during the mission of the first stream of droplets 330a. The voltage $V_v$ may be applied in the same way during emission of subsequent streams of droplets. In this way consecutive droplets of each stream of droplets 330a-c are given charges with opposite signs. The distance between the nozzle (or more accurately the droplet formation point) should be smaller than the distance between two droplets otherwise the electrode cannot apply different voltages to successive droplets.

As may be seen from FIG. 5, the voltages applied to droplets of a stream of droplets increase as a function of time. Thus, for example, the first droplet of the first stream of droplets 330a has a relatively small positive charge, the second droplet of the first stream of droplets 330a has a larger negative charge, the third droplet of the first stream of droplets 330a has a larger positive charge, etc.

Alternatively another possibility is that the magnitude of the voltages may stay the same (though still alternate in sign) so that droplets have the same speed but alternating positive and negative charges of the same magnitude. Using an extra electrode downstream of electrode 332 one could speed up half of the droplets and slow down the other half leading to two-by-two droplet coalescence resulting in the formation of neutral droplets at half the initial droplet frequency.

The modulating voltage source 338 also applies a voltage to the electrode 332. The voltage is modulated such that the electrode 332 generates an electric field which accelerates both the positively charged droplets and/or the negatively charged droplets. The last droplet of the stream of droplets 330a-c has the greatest charge and therefore experiences the greatest acceleration. The first droplet of the stream of droplets has the smallest charge and therefore experiences the smallest acceleration. Intermediate droplets experience intermediate accelerations, droplets nearer the end of the stream of droplets experiencing greater acceleration. The different accelerations experienced by the droplets causes them to move closer together, thereby promoting coalescence of the stream of droplets into a single droplet 336. The single droplet 336 passes through an opening 334 in the electrode 332, and may pass to a plasma formation location 211 (see FIG. 2). If $t_{silent}$ is equal to zero later there will be a part of the sequence of droplets where later droplets will be slower than earlier droplets which again will result in coalescence. Indeed any modulation of the magnitude of signal $V_V$ leads to coalescence with a final droplet frequency equal to the modulation frequency.

Another possibility is that the voltages with which the droplets are accelerated decrease with time.

Since half of the droplets of the stream of droplets 330a-c have a positive charge and half of droplets have a negative charge, the single droplet 336 formed via coalescence has a neutral charge (or a charge which is close to neutral, e.g., less than the charge of any of the droplets of the stream of droplets).

In addition to promoting coalescence of the stream of droplets 330a-c into a single droplet 336, the field generated by the electrode 332 also accelerates the droplets. The single droplet 336 thus has a velocity which is greater than the velocity that it would have had if the electrode 332 were not present.

The time period $t_{silent}$ during which the voltage applied to the fuel droplet emitter 310 is zero may be any suitable time period. The time period $t_{silent}$ may for example be reduced to zero.

Although the voltage applied to the first droplet of the stream of droplets 330a-c is positive in the illustrated embodiments, the voltage may instead be negative.

A controller CT may be used to control the voltage $V_v$ applied to the fuel droplet emitter 310, and to control the voltage applied to the electrode 332. The controller CT may also control actuation of the piezoelectric actuator of the fuel droplet emitter 310, and may control other aspects of the fuel droplet emitter.

This embodiment could be used with droplet-on-demand systems since in that case it is much easier to know when a droplet is produced and then synchronize the voltage to it. However it is also possible to synchronize the voltage modulation to the Rayleigh break-up mechanism and therefore the embodiment can also be used with droplet emitters that use the Rayleigh break-up mechanism (whether electrically or mechanically stimulated or not).

FIG. 6 schematically illustrates a further alternative embodiment of the present invention. In this embodiment an alternating voltage is applied by a voltage source 348 to the fuel droplet emitter 310. Although fuel emitted from the fuel droplet emitter 310 is initially in the form of a continuous stream, the continuous stream breaks up into a stream of droplets 340 some time after being emitted (e.g., due to Rayleigh breakup).

The alternating voltage source 348 is also connected to an electrode 342. The electrode 342 creates an electric field which accelerates the fuel droplets of the stream of droplets 340. Because half of the droplets have a positive charge and half of the droplets have a negative charge, coalescence of the droplets into larger droplets 346 is promoted. When the alternating voltage has a zero mean the droplets 346 will be neutral.

The magnitude of the voltage applied by the alternating voltage source 348 determines the distance from the fuel droplet emitter 310 at which coalescence into larger droplets 346 occurs because when the magnitude of the alternating voltage is larger there is a greater variation in the droplet speeds and thus coalescence occurs earlier. The frequency of the voltage applied by the alternating voltage source 348 determines the frequency of the larger fuel droplets 346 and determines the size of the larger fuel droplets because the frequency of the modulation determines the frequency of the speed modulation which in turn determines how many droplets are coalesced and thus the size of the resulting coalesced droplet.

The electrode 342 is provided with an opening 344 through which the stream of droplets 340 passes. If coalescence of the stream of droplets 340 into larger fuel droplets 346 has occurred before the electrode 342, then the larger fuel droplets pass through the opening 344.

FIG. 7 shows schematically a further alternative embodiment of the present invention. In this further alternative embodiment a constant voltage source 360 is connected to the fuel droplet emitter 310, and is arranged to apply a charge to fuel emitted by the fuel droplet emitter. The charge may be a negative charge or a positive charge.

The constant voltage source 360 is also connected to an electrode 352. The electrode 352 has a charge which is opposite in sign to the charge applied to the fuel emitted from the fuel droplet emitter 310. The electrode 352 thus applies an attractive force to the fuel, thereby accelerating the fuel towards the electrode.

As is represented schematically in FIG. 7, the fuel may be emitted from the fuel droplet emitter 310 as a constant stream, and the fuel may break up into fuel droplets 350 (e.g., due to Rayleigh breakup).

A modulating voltage source 358 applies a voltage modulation to the electrode 352. The voltage modulation applied to the electrode 352 generates an electric field which promotes coalescence of the fuel droplets 350 into larger fuel droplet stream 356. The modulation may for example have a frequency which corresponds with the frequency of the larger fuel droplets 356. A first part of the modulation may for example have the same sign as the charge of the fuel droplets 350, thereby applying a repelling force to the fuel droplets and causing them to decelerate. A second part of the modulation may for example have an opposite sign to the charge of the fuel droplets, thereby applying an attractive force to the fuel droplets and causing them to accelerate. The fuel droplets may thus move closer together, promoting coalescence into a larger fuel droplet 356.

An ionized gas (not shown) may be provided after the electrode 352, the ionised gas acting to neutralise charge applied to the fuel by the fuel droplet emitter 310. The ionised gas may be provided by any suitable ionized gas source.

In a further alternative embodiment (not shown) voltages having the same sign but different magnitudes are applied to fuel emitted from the fuel droplet emitter. A constant electric field is applied by an electrode located away from the fuel droplet emitter. The constant electric field applies a stronger force to fuel droplets with a larger charge and applies a weaker force to fuel droplets with a smaller charge. This causes different accelerations to be applied to the fuel droplets, thereby promoting coalescence into larger fuel droplets.

For all embodiments a signal with a frequency close to the Rayleigh break-up frequency (i.e., within a factor of about 10) may be added to the voltages here in order to promote Rayleigh break-up.

A tube shaped piezo-electric actuator (e.g., the piezo-electric actuator 306 shown in FIG. 3) can be driven in different modes, e.g., a length key tone ½ λ mode, a thickness (radial) key tone ½ λ mode, bending modes, higher order resonances (overtones). These characteristic modes are influenced by how the piezo-electric actuator is mounted. The piezo-electric actuator 306 shown in FIG. 3 may be driven in the thickness ½ λ mode. The thickness mode frequency of the piezo-electric actuator 306 is lowered by the presence of the capillary 304. The piezo-electric actuator 306 experiences the capillary 304 as extra mass and also increased stiffness. The presence of the fuel 302 in the capillary 304 also changes the thickness mode frequency of the piezo-electric actuator 306. The piezo-electric actuator 306 may be driven in its thickness (radial) mode such that it generates a standing wave in the capillary 304. The combined thickness of the piezo-electric actuator 306 and the wall of the capillary 304 may be around XX mm. If the standing wave has ½λ=XXmm, then associated frequency of the standing wave may be calculated using the speed of sound in the piezo-electric actuator 306 and the wall of the capillary 304. The piezo-electric actuator 306 may be ceramic and the capillary 304 may be glass. The speed of sound in these materials may be 4000 m/s. An estimate of the frequency F of the standing wave is therefore (wavelength=2*thickness):

$$F = \text{speed of sound}/\text{wavelength} = XX \text{ MHz} \quad \text{(Equation 9)}$$

This is close to the Rayleigh frequency. Therefore, the piezo-electric actuator 306 may be driven to modulate the capillary 304 at the Rayleigh frequency.

The diameter of the nozzle 308 may for example be 3 microns or more. Providing the nozzle 308 with a diameter of less than 3 microns may make the nozzle susceptible to clogging due to contamination.

It may be desirable to provide fuel droplets having a diameter of around 20 microns. Fuel droplets of this diameter are sufficiently large that the risk of the laser beam 205 missing the fuel droplets is very small, and are sufficiently small that most of the fuel is vaporized by the laser beam and contamination due to unvaporized fuel material is low.

The nozzle may have a diameter which is smaller than that which would naturally generate fuel droplets having a diameter of around 20 microns (due to Rayleigh breakup). The nozzle may thus generate smaller fuel droplets that subsequently coalesce together to form fuel droplets having a desired diameter.

The fuel droplets may be provided with a desired velocity, e.g., by accelerating the fuel droplets using an electrode. It may be desirable for the fuel droplets to have a high velocity (e.g., 100 m/s or higher). This is because the higher the velocity the greater the separation distance between fuel droplets (for a given frequency of fuel droplet delivery at the plasma formation location). A greater separation is desirable because it reduces the risk that plasma generated by a preceding fuel droplet interacts with the next fuel droplet, for example causing a modification of the trajectory of that fuel droplet. A separation of 1 mm or more between droplets delivered to the plasma formation location may be desirable (although any separation may be used).

One or more embodiments of the present invention may provide the advantage that the piezo-electric actuator is driven at or close to its own resonance frequency (taking into account the capillary wall and any material located between the capillary wall and the piezo-electric actuator). This allows the piezo-electric actuator to be driven more efficiently than would otherwise be the case.

The values of fuel droplet velocity, fuel droplet size, fuel droplet separation, fuel pressure in the reservoir, frequency of modulation applied by the piezo-electric actuator, diameter of the nozzle, are merely examples. Any other suitable values may be used.

In the above described embodiments of the present invention the fuel droplets are liquid tin. However, the fuel droplets may be formed from one or more other materials (e.g., in liquid form).

The piezo-electric actuator 306 is merely an example of an actuator which may be used to apply pressure modulation to the liquid fuel. Any suitable actuator may be used.

Radiation generated by the source may for example be EUV radiation. The EUV radiation may for example have a wavelength within the range of 5-20 nm, for example within the range of 13-14 nm, for example within the range of 5-10 nm such as 6.7 nm or 6.8 nm.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, LED's, solar cells, photonic devices, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. The descriptions above are intended to be illustrative, not limiting. Thus it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A radiation source fuel droplet stream generator comprising:
a fuel droplet emitter configured to emit groups of fuel droplets, each group comprising a first subset of fuel droplets and a second subset of fuel droplets, the fuel droplet emitter being connected to a modulating voltage source configured to apply a first voltage to the first subset of fuel droplets and to apply a second voltage to the second subset of fuel droplets such that (i) droplets of the first subset of fuel droplets an electrical charge of opposite polarity to an electrical charge of droplets of the second subset of fuel droplets or (ii) droplets of the first subset of fuel droplets have magnitudes of electrical charge that are different than magnitudes of electrical charge of droplets of the second subset of fuel droplets,
a first electrode located close to the fuel droplet emitter,
a second electrode located further away from fuel droplet emitter, and
a voltage source configured to apply a potential difference between the first and second electrodes and thereby generate an electric field between the first and second electrodes which applies a decelerating force to one of the first and second subsets of fuel droplets and applies an accelerating force to the other of the first and second subsets of fuel droplets.

2. The radiation source of claim 1, wherein the first and second voltages are respectively positive and negative relative to a voltage at which the first electrode is held.

3. The radiation source of claim 1, wherein the first electrode is held at zero potential.

4. The radiation source of claim 1, wherein a potential difference between the first and second electrodes is substantially constant.

5. The radiation source of claim 1, wherein no voltage is applied to the groups of fuel droplets for a period of time between the application of the first voltage and the second voltage.

6. The radiation source of claim 1, wherein a magnitude of the first voltage relative to the voltage applied to the first electrode is the same as the magnitude of the second voltage relative to the voltage applied to the first electrode.

7. The radiation source of claim 1, wherein a magnitude of the first voltage relative to the voltage applied to the first electrode is different from the magnitude of the second voltage relative to the voltage applied to the first electrode.

8. The radiation source of claim 1, wherein the first voltage and the second voltage are applied for the same periods of time.

9. The radiation source of claim 1, wherein the first voltage and the second voltage are applied for different periods of time.

10. A radiation source fuel droplet stream generator comprising
a fuel droplet emitter configured to form groups of fuel droplets, each group comprising a first subset of fuel droplets and a second subset of fuel droplets;
an electrode located close to the formation point of droplets formed by the emitter, and
a voltage source configured to apply an alternating voltage between the emitter and the electrode
whereby alternate droplets in the first and second subsets of fuel droplets are given electrical charges of alternating sign.

11. The radiation source of claim 10, wherein in a sequence of droplets of the first and second subsets of fuel droplets the magnitude of the charge on every other droplet increases.

12. The radiation source of claim 11, wherein after the sequence of droplets of the first and second subsets of fuel droplets there is a period of time in which no voltage is applied before the next sequence.

13. The radiation source of claim 10, wherein the application of the alternating voltage is synchronized with the formation of droplets of the groups of fuel droplets.

14. A radiation source fuel droplet stream generator comprising:
a fuel droplet emitter configured to form groups of fuel droplets, each group comprising a first subset of fuel droplets and second subset of fuel droplets,
an electrode, and
a voltage source configured to apply an alternating voltage between the emitter and the electrode,
whereby droplets of the first subset of fuel droplets are formed of opposite electrical signs or of the same sign but different magnitudes than droplets of the second subset of fuel droplets, and whereby the first subset of fuel droplets are either accelerated or decelerated towards the electrode promoting coalescence of the first subset of fuel droplets with the second subset of fuel droplets.

15. The radiation source of claim 14, wherein a constant voltage is additionally applied to the emitter.

16. A radiation source fuel droplet stream generator comprising:
a fuel droplet emitter configured to form groups of fuel droplets, each group comprising a first subset of fuel droplets and second subset of fuel droplets,
an electrode, and
a modulating voltage source connected to the emitter for controlling the relative speeds of droplets of the first and second subsets of fuel droplets between the emitter and the electrode by providing at least one of (a) droplets of the first subset of fuel droplets have an electrical charge that has opposite polarity to the electrical charge of droplets of the second subset of fuel droplets and (b)

droplets of the first subset of fuel droplets having magnitudes of electrical charge that are different than magnitudes of electrical charge of droplets of the second subset of fuel droplets, whereby coalescence of smaller droplets of the first and second subsets of fuel droplets into larger droplets is facilitated.

17. The radiation source of claim 16, wherein the relative speed of droplets of the first and second subsets of fuel droplets is controlled by modulating an electric field.

18. A lithographic apparatus comprising:
a radiation source configured to produce a radiation beam, the radiation source comprising:
  a fuel droplet emitter configured to form groups of fuel droplets, each group comprising a first subset of fuel droplets and a second subset of fuel droplets,
  an electrode, and
  a modulating voltage source connected to the emitter for controlling the relative speeds of droplets of the first subset of fuel droplets and droplets of the second subset of fuel droplets between the emitter and the electrode by providing at least one of (a) droplets of the first subset of fuel droplets having an electrical charge of opposite polarity to an electrical charge of droplets of the second subset of fuel droplets and (b) droplets of the first subset of fuel droplets having magnitudes of electrical charge that are different than magnitudes of electrical charge of droplets of the second subset of fuel droplets,
  whereby coalescence of smaller droplets of the first and second subsets of fuel droplets into larger droplets is facilitated,
an illumination system configured to condition a radiation beam,
a support constructed to support a patterning device, the patterning device being capable of imparting the radiation beam with a pattern in its cross-section to form a patterned radiation beam,
a substrate table constructed to hold a substrate, and
a projection system configured to project the patterned radiation beam onto a target portion of the substrate.

19. A method of promoting coalescence of groups of radiation source fuel droplets emitted from a fuel droplet emitter, each group comprising a first subset of radiation source fuel droplets and a second subset of radiation source fuel droplets, the method comprising controlling the relative speeds of the first subset of radiation source fuel droplets and a second subset of radiation source fuel droplets by applying a modulating voltage to the emitter.

20. The radiation source fuel droplet stream generator of claim 1, wherein the first subset of fuel droplets precedes the second subset of fuel droplets in a direction of travel of the plurality of fuel droplets.

21. The radiation source fuel droplet stream generator of claim 1, wherein droplets of the first subset of fuel droplets alternate with droplets of the second subset of fuel droplets.

22. The radiation source fuel droplet stream generator of claim 14, wherein the first subset of fuel droplets precedes the second subset of fuel droplets in a direction of travel of the plurality of fuel droplets.

23. The radiation source fuel droplet stream generator of claim 14, wherein droplets of the first subset of fuel droplets alternate with droplets of the second subset of fuel droplets.

24. The radiation source fuel droplet stream generator of claim 16, wherein the first subset of fuel droplets precedes the second subset of fuel droplets in a direction of travel of the plurality of fuel droplets.

25. The radiation source fuel droplet stream generator of claim 16, wherein droplets of the first subset of fuel droplets alternate with droplets of the second subset of fuel droplets.

26. The lithographic apparatus of claim 18, wherein the first subset of fuel droplets precedes the second subset of fuel droplets in a direction of travel of the plurality of fuel droplets.

27. The lithographic apparatus of claim 18, wherein droplets of the first subset of fuel droplets alternate with droplets of the second subset of fuel droplets.

28. The method of claim 19, wherein the first subset of radiation source fuel droplets precedes the second subset of radiation source fuel droplets in a direction of travel of the plurality of radiation source fuel droplets.

29. The method of claim 19, wherein droplets of the first subset of radiation source fuel droplets alternate with droplets of the second subset of radiation source fuel droplets.

* * * * *